United States Patent
Cowie

(10) Patent No.: US 8,831,019 B2
(45) Date of Patent: Sep. 9, 2014

(54) PATH RECONSTRUCTION AND INTERCONNECTION MODELING (PRIM)

(71) Applicant: Renesys, Hanover, NH (US)

(72) Inventor: James H. Cowie, Deering, NH (US)

(73) Assignee: Renesys, Hanover, NH (US)

( * ) Notice: Subject to any disclaimer, the term of this patent is extended or adjusted under 35 U.S.C. 154(b) by 0 days.

(21) Appl. No.: 13/896,888

(22) Filed: May 17, 2013

(65) Prior Publication Data

US 2013/0311160 A1     Nov. 21, 2013

Related U.S. Application Data

(60) Provisional application No. 61/648,977, filed on May 18, 2012.

(51) Int. Cl.
| | |
|---|---|
| *H04L 12/56* | (2006.01) |
| *H04L 12/26* | (2006.01) |
| *G06F 17/50* | (2006.01) |
| *H04W 40/18* | (2009.01) |
| *H04W 40/20* | (2009.01) |
| *H04L 12/715* | (2013.01) |

(52) U.S. Cl.
CPC ............ *H04L 43/04* (2013.01); *G06F 17/5009* (2013.01); *H04W 40/18* (2013.01); *H04W 40/20* (2013.01); *H04L 45/04* (2013.01)
USPC ....... 370/401; 370/395.31; 370/396; 709/243

(58) Field of Classification Search
USPC ..................... 370/395.31, 395.32, 396–397, 370/400–410; 709/238–243
See application file for complete search history.

(56) References Cited

U.S. PATENT DOCUMENTS

| | | | |
|---|---|---|---|
| 7,385,937 B2 | 6/2008 | Lebrun et al. | |
| 7,821,936 B2 | 10/2010 | Meloche et al. | |
| 7,869,349 B2 | 1/2011 | Agrawal et al. | |
| 7,916,664 B2 | 3/2011 | Krishnamurthy et al. | |
| 7,936,743 B2 | 5/2011 | LeBrun et al. | |
| 8,155,126 B1 * | 4/2012 | Mao et al. .................... | 370/397 |
| 8,264,988 B2 | 9/2012 | Zhang et al. | |
| 8,385,225 B1 | 2/2013 | Downey | |
| 2004/0258002 A1 * | 12/2004 | Tran et al. .................... | 370/254 |

(Continued)

FOREIGN PATENT DOCUMENTS

| | | |
|---|---|---|
| EP | 1461883 A1 | 9/2004 |
| EP | 1570604 A1 | 9/2005 |
| WO | WO-0221801 A1 | 3/2002 |

OTHER PUBLICATIONS

Quoitin et al., Interdomain Traffic Engineering with BGP, May 2003, IEEE, p. 122-128.*

(Continued)

*Primary Examiner* — Hoon J Chung
(74) *Attorney, Agent, or Firm* — Goodwin Procter LLP

(57) ABSTRACT

Internet data such as Border Gateway Protocol routing information and traceroute measurements are processed to create realistic predictive models of the paths IP traffic is likely to take between any two points on the Internet, even when direct measurements of the paths is not feasible. The prediction includes three categories: topology (what paths may exist), weighting (which paths are more or less likely to be taken under varying operational circumstances), and performance (latency, loss, jitter, etc. across the predicted paths).

19 Claims, 5 Drawing Sheets

(56) References Cited

U.S. PATENT DOCUMENTS

2005/0018647 A1  1/2005  Lebrun et al.
2008/0080507 A1  4/2008  Swallow et al.
2009/0182896 A1* 7/2009  Patterson et al. ............. 709/241

OTHER PUBLICATIONS

Gao, L., (2001) "On Inferring Autonomous System Relationships in the Internet," *IEEE*, vol. 9, No. 6, pp. 733-745.

Katz-Bassett, et al., (2010) "Reverse traceroute." Proceedings of the 7th USENIX conference on Networked systems design and implementation. USENIX Association, [<http://static.usenix.org/event/nsdi10/tech/full_papers/katz-bassett.pdf>].

Rekhter, et al., (2006) "A Border Gateway Protocol 4 (BGP-4)," Network Working Group, Retrieved from the internet on May 16, 2013 at <http://www.ietf.org/rfc/rfc4271.txt>, 98 pages.

* cited by examiner

PATH RECONSTRUCTION AND INTERCONNECTION MODELING (PRIM)

RELATED APPLICATIONS

This application claims priority to and the benefit of U.S. Provisional Patent Application No. 61/648,977, filed on May 18, 2012, which is incorporated herein by reference in its entirety.

BACKGROUND

Any point (server, laptop computer, a network-ready device, a wireless hand-held device, etc.) can establish a communication link via the Internet with another point and data can be exchanged between these two points. The exchanged data can be a short text message, a document, or a multi-media object, and even streaming audio/video. It is difficult to know how traffic may flow between two selected points on the Internet at a given time. In an ideal situation, we would simply log into one of the endpoints, run a traceroute to the other location (or perform a similar procedure), and observe the path traffic takes. Then we would repeat the experiment in reverse to observe the opposite (and not necessarily symmetric) path. Typically, however, one cannot log into just any Internet point and run such measurements.

The data traffic from one endpoint to another generally flows via systems (routers, cables, wireless links, etc.) of one or more Autonomous Systems (AS). A pair of points on the Internet may communicate with each other via one or more AS's. When the communication occurs via two or more AS's, a physical (electrical) connectivity between those AS's is required but is usually not adequate; a contractual relationship must also exist between those AS's An estimate of the path to be taken by traffic between two points can, however, be useful in several ways. A user may be able obtain estimates of various traffic characteristics such as average delay, delay jitter, reliability of the connection, etc. Furthermore, in some situations a user at one endpoint can choose between feasible alternate paths to the other endpoint. That decision can be informed by the knowledge of the expected traffic characteristics, that can change from time to time. Some techniques allow for estimation of various traffic characteristics when an actual, router-level path between the points of interest is provided. These methods are not applicable, however, when the actual router-level paths are not provided. Therefore, there is a need for a technique that can efficiently predict a path between two endpoints on the Internet. There is also a need for techniques that can estimate various traffic characteristics without relying on the knowledge of actual router-level paths.

SUMMARY

Various embodiments of the present invention facilitate accurate prediction of a likely path between two specified endpoints on the Internet. The path can be predicted at the AS level and also at a router level. If an AS-level path is computed or obtained otherwise, characteristic of the router-level path can also be determined. This is achieved by, in part, modeling the connectivity of the two endpoints. In general, there are three phases to this predictive process: identifying the paths along which traffic can reasonably flow (topology), identifying the paths along which we believe most traffic will flow (weighting), and predicting the performance characteristics of those paths (congestion, latency, packet loss, jitter).

In the end, we can use these models to rank and rate rival paths across the Internet between two points, or between two prefix sets (regions of Internet address space), for purposes of helping enterprise customers manage their planetwide Internet connectivity more intelligently. Network operations staff within the enterprise can use PRIM's predictions to compare their actual experience (the paths their traffic actually takes through the Internet) with the ideal experience supported by the "best" path available through a given provider or set of providers.

Strategic planners within enterprise IT can use these techniques to learn what paths are possible, and which of these paths are desirable ("fit for purpose" for their particular application environment, whether that be voice, video, file transfer, financial trading, or any other Internet-delivered service). They can identify and quantify the paths available through their current provider, and compare them to competing paths available through other feasible future providers. These modeling techniques can help strategic planners manage end-to-end connectivity variants as they would an investment portfolio, understanding the relative strengths, weaknesses, and risks of various wide-area connectivity alternatives in combination.

There may be other applications of such models beyond the immediate applications in network operations and strategic planning, including risk assessment, insurance and other actuarial applications, compliance monitoring, cybersecurity, business intelligence, market analysis, the preparation of what-if scenarios, and the assessment of network impairment due to disaster or attack.

Accordingly, in one aspect a method, an article of manufacture that includes instructions stored thereon, and/or a system facilitates reconstruction of a path between two endpoints. The reconstruction includes performing at a server generation of a set of connectivity modes based on border control gateway protocol (BGP) messages received via an interface. Each connectivity mode represents an autonomous system (AS)-level path between a first endpoint and a second endpoint. A user may be interested in sending data from the first (source) endpoint to the second (destination) endpoint, and may also receive data at the first endpoint from the second endpoint. For each one of the connectivity modes in the set, a pivotal region that includes at least one AS is identified.

The reconstruction also includes generating, based on routing data, a number of feasible physical paths, each of which represents a router-level path between a proxy to the first endpoint and a proxy to the second endpoint. From the number of feasible physical paths, a frontier set is determined, and the frontier set includes at least one router interface. A connectivity mode from the set of connectivity modes is selected, and a router interface in the frontier set is identified such that the identified router interface is determined to be associated with at least one of the ASs in the pivotal region of the selected connectivity mode. A router-level path associated with the identified router interface is designated as a plausible path.

In some embodiments, an AS-level path representing a connectivity mode included in the set of connectivity modes is generated, at least in part, by determining a transit relationship and/or a peering relationship between a pair of ASs. An edge from a transit provider to a transit customer may be preserved in the AS-level path, while any edge from the transit customer to the transit provider may be excluded. In some embodiments, the AS-level path includes at the most one pair of AS's such that the relationship between the two AS's of the pair is determined to be a peering relationship. Even though two AS's may appear to be in communication with each other, the exclusion of an edge from a customer to a provider and/or restricting the peering AS's as described above, enables accurate modeling of AS-level paths by taking into consideration BGP and other routing policies of these AS's.

In some embodiments, if an announcement of a BGP origination of a route to a network prefix corresponding to an identified router interface is received from at least one of the ASs in the pivotal region of a connectivity mode, the identified router interface is determined to be associated with that AS.

A connectivity mode may be selected, at least in part, by analyzing observations of BGP reachability between a pair of AS of a candidate connectivity mode during a predetermined period. If the observed reachability is at least equal to a preselected threshold that candidate mode is selected, and otherwise the candidate mode is rejected. The BGP reachability can indicate how frequently paths between a pair of AS's on the AS-level path representing the candidate mode are announced and/or withdrawn, and can thus be a measure of reliability of the candidate mode.

For example, in one embodiment, a connectivity mode is selected, at least in part, as follows: For each connectivity mode in the set of connectivity modes, BGP reachability between the first and second endpoints along the AS-level path representing the mode, observed during a predetermined period, is analyzed. A first probability of connection from the first endpoint to the second endpoint along the AS-level path is computed, and a second probability of connection from the second endpoint to the first endpoint along the same AS-level path is also computed. A connectivity mode is selected based on the computed probabilities. For example, a probability in one direction, i.e., from the first to the second endpoint or from the second to the first endpoint is maximized, or the mode is selected such that a simple or weighted combination of the two probabilities is maximized.

In some embodiments, the selection of a connectivity mode comprises weighing each connectivity mode in the set of connectivity modes based on BGP data received from several BGP observers. A BGP observer is typically a source that monitors BGP data, providing a BGP perspective. Each connectivity mode may be weighted based on reachability of one or more BGP peers/observation points that are a direct or indirect customer of that AS or service provider of which the first and/or second endpoints are also direct or indirect customers.

In some embodiments, path reconstruction further includes selecting the proxy to the first endpoint. The proxy selection includes determining from BGP data a prefix associated with the first (e.g., source) endpoint, and designating a responding host within the prefix as the proxy to the first endpoint. As both the proxy and the first endpoint share a common prefix, a path from/to the proxy is likely to be similar or representative of a path from/to the first endpoint. The proxy selection may also include determining from BGP data a prefix associated with the second (e.g., destination) endpoint, and designating a responding host within that prefix as the proxy to the second endpoint.

The determination of the frontier set may include receiving router-level data collected at a number of collectors. For example, a first path from a first collector to the proxy to the first endpoint is received. A second path from a second collector to the proxy to the second endpoint is also received, and a router interface associated with both the first and second paths is identified. The determination of the frontier set may include selecting a pivotal region, and selecting an entry point into the pivotal region and an exit point from the pivotal region. A shortest path from the entry point to the exit point may be identified, and router interfaces that are not present on the shortest path may be removed from the frontier set. The first collector may be different than each of the first endpoint, the second endpoint, the proxy to the first endpoint, and the proxy to the second endpoint. The second collector may also be different than each of the first endpoint, the second endpoint, the proxy to the first endpoint, and the proxy to the second endpoint. In some embodiments, the first collector is also different than the second collector, while in other embodiments the second collector is the same as the first collector.

In some embodiments, path reconstruction further includes estimating performance of the plausible path. The estimated performance may include one or more of a delay, jitter, reliability, and availability. Estimation of the performance includes, for a connectivity mode in the set of connectivity modes, computing a transition probability that the mode is replaced by another mode in the set. The transition probability may be computed using BGP data. The mode selection may be based, at least in part, on transition probability. By taking into consideration the transition probabilities, the estimated performance can represent an aggregate performance of two or more plausible paths associated with different likely modes.

In some embodiments, the plausible includes a number of router interfaces, and the performance estimation includes analyzing an instance of a router timing model, an instance of an edge timing model, or both. The instance of the router timing model may correspond to a router interface within the several of router interfaces, and can account for a processing delay within the corresponding router interface. The instance of the edge timing model may correspond to an edge between a pair of adjacent router interfaces within the several router interfaces, and can account for a transition delay involved in exchanging data between the two router interfaces in the pair. The router timing model may include a statistical timing model based on, at least in part, historically observed performance values at a router interface. The edge timing model may also include a statistical timing model based on, at least in part, historically observed performance values at an edge between a pair of adjacent router interfaces.

In some embodiments, the performance estimation further includes building an aggregate timing model. The aggregation may include first and second instances of the router timing model, and the first and second instances may correspond to first and second router interfaces within the number of router interfaces. Alternatively or in addition, the aggregation may include first and second instances of the edge timing model, and these first and second instances may correspond to an edge between a first pair of router interfaces and an edge between a second pair of router interfaces, respectively. The first and second pairs may be selected from the number of router interfaces. Additionally or alternatively, the aggregation may include the first instance of the router timing model and the first instance of the edge timing model. Thus, the aggregated model can account for performance of one or more routers interfaces forming a path, performance of one or more edges between the router interfaces, and/or performance of a combination of one or more router interfaces and one or more edges.

In some embodiments, performance estimation further includes updating the instance of the router timing model based on, at least in part, a measured delay at the router interface associated with that instance. The instance of the edge timing model may also be updated based on, at least in part, a measured delay at the edge associated with that instance.

In another aspect, a method, an article of manufacture that includes instructions stored thereon, and/or a system facilitates estimation of intra-mode paths, which includes receiving in memory at least a partial autonomous system (AS)-level path that includes a first AS and a second AS. The partial and/or endpoint-to-endpoint AS-level path corresponding to a mode of communication or a connectivity mode between a first (e.g., source) endpoint and a second (e.g., destination) endpoint. The estimation of intra-mode paths also includes selecting a first hand off pair that includes an exit point from the first AS and an entry point into the second AS. The exit point is in communication with the entry point, so that traffic can be delivered from the first AS to the second AS at the exit point-entry point pair.

The selection of the exit and entry points is based on, at least in part, one or more of: (i) a property of the first AS, (ii) a property of the second AS, and (iii) a statistical property of traffic that passes via the first AS and is associated with a proxy to the first endpoint and/or a proxy to the second endpoint. The estimation of intra-mode paths further includes identifying a set of router-level paths within the first AS, from a first entry point into the first AS to the exit point from the first AS within the first hand off pair. Thus, traffic may flow within the first AS from the first entry point thereof to the exit point in the first hand off pair. Thereafter, the traffic may be handed off to the second AS, e.g., for ultimate delivery to the second (e.g., destination) endpoint.

The property of the first and/or second AS includes one or more of: (i) a number of router-level hop counts within the first AS on a path from the first entry point into the first AS to the exit point from the first AS within the first hand off pair, (ii) a geographic distance between the first entry point into the first AS and the exit point from the first AS within the first hand off pair, and (iii) a number of points of presence associated with both the first AS and the second AS.

The selection of the exit and entry points may include maximizing a first distance within the first AS. The first distance may include one or more of: (i) a number of hop counts on a path to the exit point from the first AS within the first hand off pair, and (ii) a geographic distance between the first entry point into the first AS and the exit point from the first AS within the first hand off pair. The selection of the exit and entry points may include, additionally or in the alternative, minimizing a second distance from the exit point from the first AS within the first hand off pair to the proxy to the second endpoint. The second distance may include one or more of: (i) a number of hop counts on a path from the exit point from the first AS within the first hand off pair to the proxy to the second endpoint, and (ii) a geographic distance between the exit point from the first AS within the first hand off pair and the proxy to the second endpoint. When the first distance is maximized and the second distance is minimized, the handling of the traffic by the first AS is maximized. The first distance may also be minimized, maximizing the second distance, such that the handling of the traffic by the first AS is minimized.

In some embodiments, the selection of the first hand off pair includes selecting a candidate exist point from the first AS, and selecting a candidate entry point into the second AS. The candidate exit and entry points are selected such that a frequency of traversal of traffic between the candidate exit point and the candidate entry point is greater than a selected threshold. The selected candidate exit point is designated as the exit point within the first hand off pair, and the selected candidate entry point is designated as the entry point within the first hand off pair. The frequency of traversal of traffic may include a frequency of traffic directed to the proxy to the first endpoint and/or the proxy to the second endpoint. The frequency of traversal of traffic may also include, alternatively or in addition, a frequency of traffic received from the proxy to the first endpoint and/or from the proxy to the second endpoint. Thus, the frequency of traversal of traffic can correspond to the frequency of any traffic flowing between a candidate exit point and a candidate entry point, or to the frequency of traffic that is related to the proxy to the first endpoint, proxy to the second endpoint, or both.

In some embodiments, the estimation of intra-mode paths further includes selecting a router-level path from the identified set of router-level paths such that a path metric corresponding to the selected router-level path satisfies a specified threshold. The path metric may include one or more of a frequency of traversal of traffic via the selected router-level path, delay, jitter, reliability, and availability.

One or more router-level paths in the identified set may each include an intermediate router node, and the path metric may include a frequency of traversal of traffic via an intermediate router node. A path may be selected if most traffic, as indicated by the frequency of traversal, flows via an intermediate router node on that path. The frequency of traversal of traffic via the intermediate router node may include a frequency of traffic directed to/from the proxy to the first endpoint, the proxy to the second endpoint, or both. Thus, the frequency of traversal of traffic can correspond to the frequency of any traffic flowing via the path, or to the frequency of traffic that is related to the proxy to the first endpoint, proxy to the second endpoint, or both.

In some embodiments, the estimation of intra-mode paths further includes selecting a second hand off pair. The second hand-off pair includes an exit point from the first AS and an entry point into the second AS, and the exit point is in communication with the entry point. The selection of the second hand-off pair is based on, at least in part, one or more of: (i) a property of the first AS, (ii) a property of the second AS, and (iii) a statistical property of traffic that passes via the first AS and is associated with the proxy to the first endpoint and/or the proxy to the second endpoint. The estimation of intra-mode paths further includes identifying a set of router-level paths within the first AS, from a second entry point into the first AS to the exit point from the first AS within the second hand off pair. The second entry point into the first AS may be the same as the first entry point into the first AS.

In the following sections, we describe these modeling techniques in three parts, starting with topology (predicting the existence of paths), moving on to weighting (predicting the relative popularity of paths) and finally to performance (predicting congestion, latency, packet loss, jitter, and the like).

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

I. Predictive Internet Topology

Figure 1:
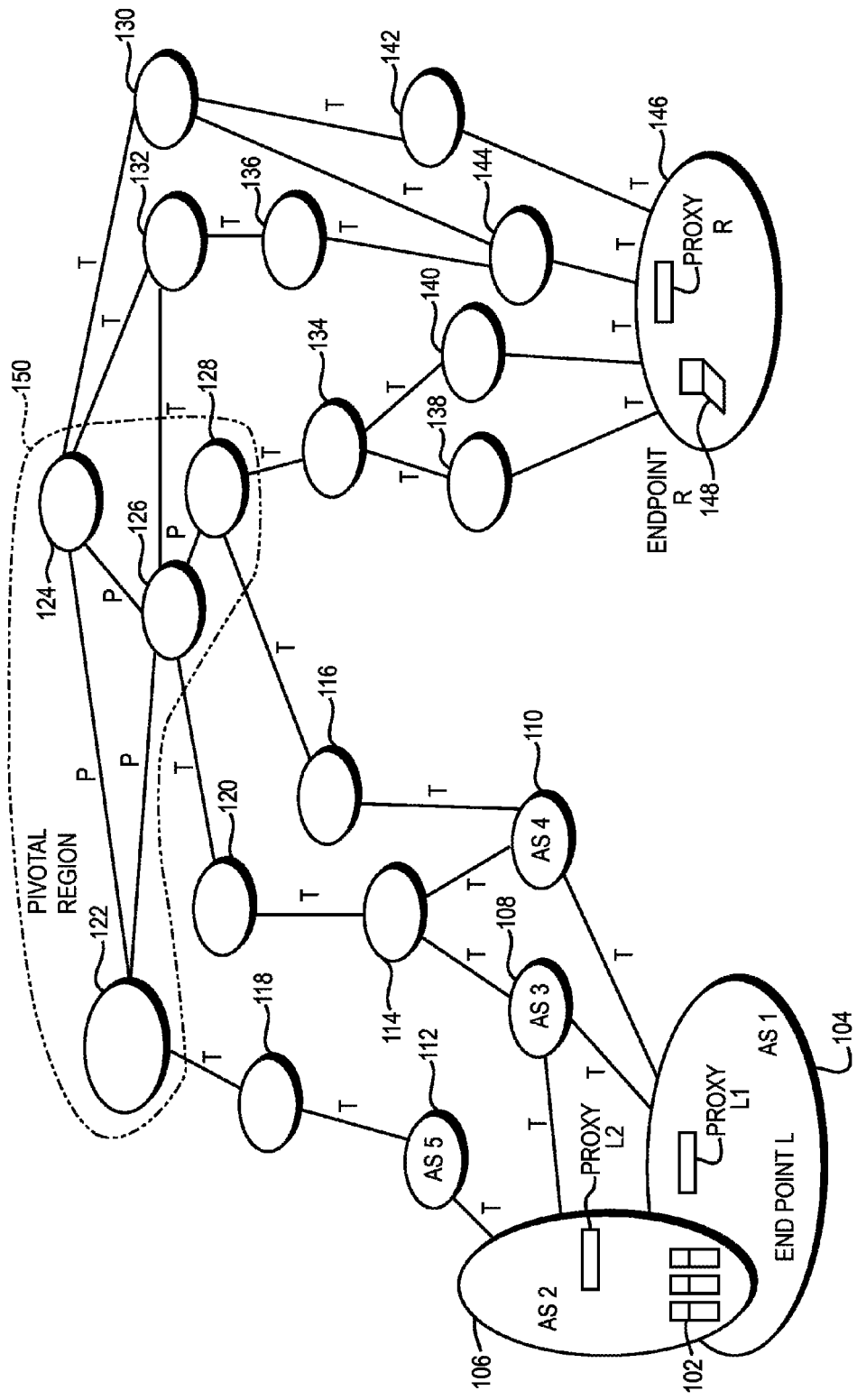
FIG. 1 schematically depicts various modes according to one embodiment.

The first challenge is to identify and map out the likely alternatives for arbitrary end-to-end physical topology. The initial goal is to simply compute a set of plausible paths that are consistent with BGP routing and observed traceroute dynamics—distinguishing the possible from the impossible—while deferring the refinement of relative probabilities of the alternative modes we identify until the next phase of analysis.

To construct a model of the plausible physical paths between a pair of endpoints, we employ an algorithm that incorporates BGP path information, relationship tags, router identification, and raw traceroute data. The process of topology derivation breaks down into four basic challenges:

1. Enumerate and classify the primary connectivity modes between the endpoints in question, starting with BGP routing data and our inter-provider relationship classification database.
2. Use the global graph formed by the union of traceroute adjacencies seen during some observation period to enumerate subgraphs of physical paths toward each of the endpoints.
3. Identify the most plausible frontier along which to unify subtraces into meaningful end-to-end paths.
4. Aggregate the resulting set of modes and paths to simplify presentation and analysis; for example, by combining paths through multiple interfaces on the same router chassis.

Step 1. Identifying Connectivity Modes

To begin the process, we note that three different kinds of inter-provider relationships may contribute to the predicted connectivity modes between two distant providers.

First are the universally visible transit edges in the global BGP graph: provider-customer relationships upstream of the endpoints. Over the course of the time period in question, the source and destination prefixes are observed to have transit relationships, directly or transitively, with a set of NSPs. For example, the originating ASN of a DSL customer may buy transit from a regional provider such as Pacnet, who in turn buys transit from Cogent and Level3.

In addition to provider-customer transit relationships, some of the providers who serve one endpoint, or the other, but not both, may have known peering relationships. In many situations, an endpoint is served by a single AS, but in some situations, a complex endpoint (such as a set of servers, a large organization, or a city), may be served by more than one AS's. Economics dictates that a valid connectivity mode, represented by a plausible end-to-end AS path, should ideally be "valley-free"; that is, it should contain at most one transit provider whose customer cone includes both endpoints, or contain exactly one peering adjacency between transit providers whose customer cones each include one of the endpoints. This "most central" provider or pair of peered providers we call the pivot region of the AS path, for reasons that will become clearer when we begin to synthesize traceroute-like paths that conform to the AS path's adjacency constraints.

The final complication in deriving connectivity modes comes in the form of what we call occult edges in the connectivity graph: additional relationships between providers that are not visible in BGP, but that are visible as unexplained adjacencies between router interfaces in the full traceroute dataset. These may represent missing hops in the traceroute data, or they may represent legitimate peering relationships that are simply not visible in BGP without a direct peering relationship within the customer cone of one side or the other. We make these occult edges available for path generation, treating them as an unexposed BGP peering edge, and seeing whether the resulting paths are consistent with measured traces.

With transit edges, peering edges, and occult edges in place, we can finally build a set of potential end-to-end AS paths that can support connectivity between the endpoints. We call each of these paths a connectivity mode, because in traditional traceroute studies, they typically give rise to one or more identifiable modes in the distribution of end-to-end round trip latencies.

With reference to FIG. 1, an EndPoint L 102 is associated with an autonomous system AS1, 104. The EndPoint L 102 is also associated with another AS, AS2 106. By observing the BGP updates, it is determined that AS1 104 has transit relationships with AS3 108 and AS4 110. AS2 106 has a transit relationship with AS5 112. These AS's have transit and peering relationships with various other AS's, as depicted in FIG. 1. In general as described herein, the observation that one AS has a transit or peering relationship with another AS implies that such a relationship was determined to exist by a processor by monitoring and analyzing BGP updates over a certain time period such as an hour, a day, a month, or several months. EndPoint R 148 is associated with AS 146 which has transit relationships with each of AS's 138, 140, 144, 142.

The AS 128 has a transit relationship with AS's 116 and 134. FIG. 1 depicts that AS 116 can exchange data with EndPoint L 102 via other AS's. Similarly, AS 134 can exchange data with EndPoint R 148. Therefore, AS 128 is designated as an AS within a pivotal region 150. As 126 is similarly designated as another AS within the pivotal region 150. AS's 122, 124 have a peering relationship, and AS 122 can exchange data with the EndPoint L 102 while AS 124 can exchange data with EndPoint R 148. Therefore, AS's 122, 124 are also included within the pivotal region 150.

Accordingly, several modes exist between EndPoint L 102 and EndPoint R 148. For example, a first mode includes an AS-level path AS1 104, AS3 108, AS 114, AS 120, AS 126 in the pivotal region 150, AS 132, AS 136, AS 144, and AS 146, for sending data from EndPoint 102 to EndPoint R 148. An AS-level path for receiving data at EndPoint L 102 from EndPoint R 148 would include the same AS's in the first mode. Alternatively, a second mode including an AS-level path AS 146, AS 140, AS 134, AS 128 in the pivotal region 150, AS 116, AS4 110, and AS1 104 is feasible for receiving data at EndPoint L 102 from EndPoint R 148.

It should be understood that FIG. 1 is illustrative only and that in general any one AS may have a transit and/or peering relationships with as few as one other AS or several (4, 10, 20, 50, etc.) AS's. Therefore, several, i.e., tens, hundreds, thousands, or more modes are feasible between any two endpoints. Various embodiments of the system described herein are configured to identify relationships between a pair of AS's based on BGP updates, and to determine several AS-level paths (or modes) between two endpoints.

Step 2. Interpreting Connectivity Modes as Physical Paths

The next step is to gather traceroute data (sequences of router interfaces) from a large, diverse pool of collectors, and build it into a connectivity graph for the entire Internet. We maintain a live population of over a million responding host interfaces, scattered throughout the entire routed Internet. On a continuous basis, we gather traces to each of these targets from a diverse population of dozens of collectors. From this set of raw traces, we create a master directed graph G, whose nodes are all observed router interfaces on earth, and whose edges are all observed interface adjacencies. G is maintained on a daily basis, and is available for inspection on any day in history since the beginning of our collection activities.

The next step in synthesizing a model of connectivity between two arbitrary sets of IP-numbered endpoints is to mine G for information about the reachability of the source and destination sets of IP addresses in question (for convenience, call these two sets L and R, as in "left" and "right"). For example, L might be the IP address of a DSL customer, and R the set of IP addresses used by a popular web service such as Facebook. Using BGP data for the observation period in question, we identify one or more most-specific routed prefixes containing the endpoints in L and R, as well as its originating autonomous system(s).

We then identify the set of live traceroute target hosts within the routed prefixes within L and R, and within every other prefix originated by the same autonomous systems. We slice global graph G to extract a pair of directed graphs $G_L$ and $G_R$ whose nodes are router interfaces and whose edges are observed interface adjacencies seen en route to targets in L or R.

Finally, we identify the "frontier set" of router interfaces common to $G_L$ and $G_R$: the set of shared global router interfaces that appear in at least one trace to some host on each side. These interfaces are potential pivot points that can be used to construct end-to-end physical paths between L and R.

This frontier set will typically be huge, on the order of thousands of nodes for two widely separated networks with diverse connectivity. It will include many interfaces within the core of the shared ASNs that provide service to both sides, only a few of which will actually be plausible points of traffic exchange for a path between L and R. It will also include many interfaces that have nothing to do with reachability of L or R, by virtue of being topologically important for the Internet connectivity of one or more of our many traceroute collectors.

Step 3. Establishing Percolation

The final step uses the routing logic of identified connectivity modes between L and R to winnow the wheat from the chaff in the frontier set. For each predicted connectivity mode, we identify pivotal frontier subsets (router interfaces that are common to traces toward L and R in G) that are routed within most-specific prefixes originated by some AS within the mode's pivot region. In general, the identified router interface (in the frontier set) is associated with one of the AS's in the pivotal region because it: has an IP address; that IP address is contained within a network prefix; and the prefix has been announced in BGP by an AS in the pivotal region. If such subsets exist, we take the set of end-to-end physical paths between L and R through these points as our model for end-to-end connectivity.

For example, if both L and R are in the customer cone of Level3 (AS3356), and if we have identified a set of common router interfaces within Level3 that are seen en route to both L and R in traces from our collectors around the world, then those common interfaces constitute a pivotal frontier subset, and we can use them as the midpoints of synthetic paths between L and R through Level3. If the frontier subset is still very large, we may select a further subset of these common interfaces that meet some selection criterion, such as appearing on the shortest path between the entry and exit points within Level3.

If there are no non-empty pivotal frontier subsets, we make one attempt to bridge an intra-ASN gap by injecting edges from another subset of global G: the traces to each side of the connectivity mode's pivot region. For example, if we can identify a short, well-supported path between the European and North American sides of a provider's backbone network, then we can use that intra-ASN path to complete the modeled end-to-end connectivity mode for which that provider is pivotal, but for which we see no common interfaces in traces to the endpoints.

Specifically, when there are no frontier routers within the pivot AS, i.e., the pivotal region, or if there are too few frontier routers (perhaps because the frontier routers we have identified are not on shortest and/or statistically most likely paths between the most likely entry/exit points for the pivot AS), we can synthesize paths through the pivot AS just as we would synthesize a path across any non-pivot AS, as described below with reference to FIGS. 3A and 3B. In particular, we pick hot potato, cold potato, and/or statistically well-supported paths that draw on the large pool of router interfaces observed in the larger universe of traces through the pivot AS, even though those router interfaces and/or the edges between them may not actually have been observed en route to one or the other endpoint.

When the frontier set is "too full" of common routers that were seen en route to both endpoints (i.e., their respective proxies), we can choose the routers in the pivotal frontier subset with respect to the most likely entry and exit points for the pivot ASN. The most likely entry point to the pivot AS is usually determined together with the most likely exit point from the previous AS, as described below, e.g., with reference to FIGS. 3A and 3B, because they are in direct communication and form a crossing point into the pivot AS. The most likely exit point(s) from the pivot AS are also selected in a similar manner. Then, we identify those elements of the frontier set that are on the high-likelihood paths between the selected entry and exit points, and we can recreate/synthesize one or more end-to-end router-level paths passing through these frontier routers within the pivot AS.

Thus, if we can identify a well-supported, high-likelihood path that includes routers from the frontier set that are determined to reach both endpoints, we can generate router-level paths from the observed connections. If we cannot identify such paths through an observed frontier set, we infer/determine the "bridge" across the pivot ASN. Typically, the pivotal AS tends to be a very busy global provider, across which we have numerous measurements to use as raw data for understanding and reconstructing the patterns of traffic flow.

Figure 2A:
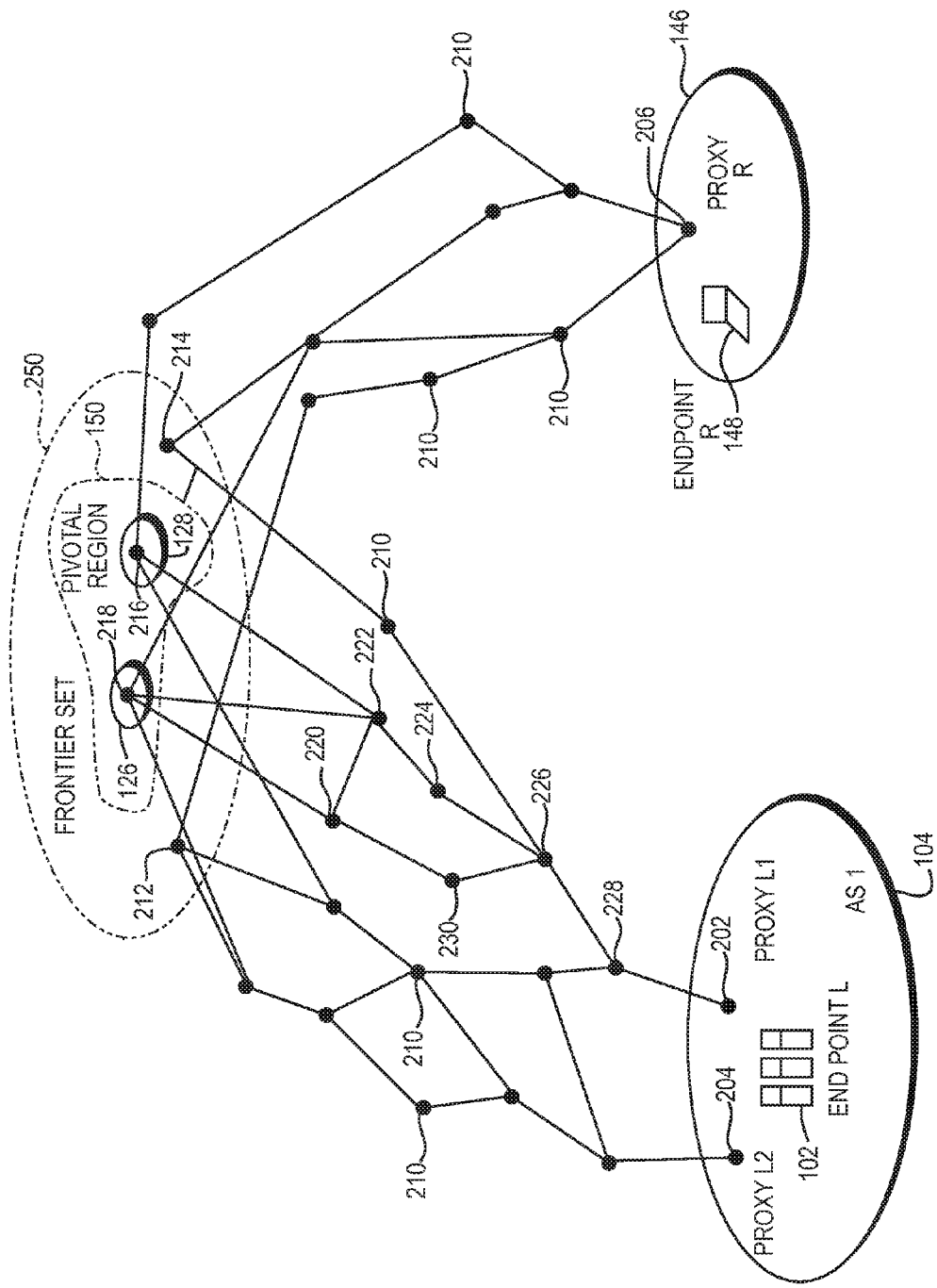
FIG. 2A schematically depicts feasible router level partial paths according to one embodiment.

With reference to FIG. 2A, the EndPoint L 102 has two proxies—Proxy L1 202 and Proxy L2 204 within the AS 104. The EndPoint R 148 has a proxy R 206. Proxy L1 202 is in communication with Proxy R 206 via several routers 210. Traceroutes to each of these proxies may be performed at one or more collectors (typically tens, hundreds, or even thousands of collectors). For the sake of clarity, the collectors are not depicted in FIGS. 2A and 2B. In some instances, the proxies would allow the traceroute to run while the actual endpoint may not. In other instances, the collectors may not be aware of a specific requested interface (e.g., an endpoint), and hence, a traceroute to that endpoint may not be available. A traceroute to a suitable proxy to that endpoint, however, can be used in this situation. The traceroute data can reveal various router-level paths between the two proxies 202, 206, in both directions. The routers 226, 228, for example, may be encountered in a traceroute to the Proxy L1 202 but not in a traceroute to the Proxy R 206. Thus, the routers 226, 228 are determined not to be useful (not likely to be encountered) in reaching the Proxy R 206 form the Internet at large from places (e.g., routers) other than Proxy L1 202. Based on the traceroute data, it is observed, however, that each of the routers 212, 214, 216, 218 is in communication with both Proxy L1 202 and Proxy R 206. Therefore, these routers are included in the frontier set 250, and the routers 226, 228 are not included. In general, a frontier set includes or consists essentially of the routers that have been seen on the way to proxies to both endpoints. It should be understood that in some situations, a proxy may be the actual endpoint of interest.

By identifying the AS corresponding to each router in the frontier set 250, it is determined that the router 216 is within the AS 128 and that the router 218 is within the AS 126. As described with reference to FIG. 1, the AS's 128, 126 are included in the pivotal region 150. Thus, the routers 126, 128 form the pivotal frontier subset 252. Once the routers in the pivotal frontier subset are determined, various router-level paths corresponding to a certain mode can be determined. For example, with reference to FIG. 2B the mode (i.e., AS-level path) that includes the AS's 104, 110, 116, 128 a router-level path exists from Proxy L1 202 and routers 228, 226, 224, 222, 216. Another partial router-level path that includes the routers 202, 228, 226, 230, 220, 218 corresponds to a different mode that includes the AS's 104, 110, 114, 120, 126.

Figure 2B:
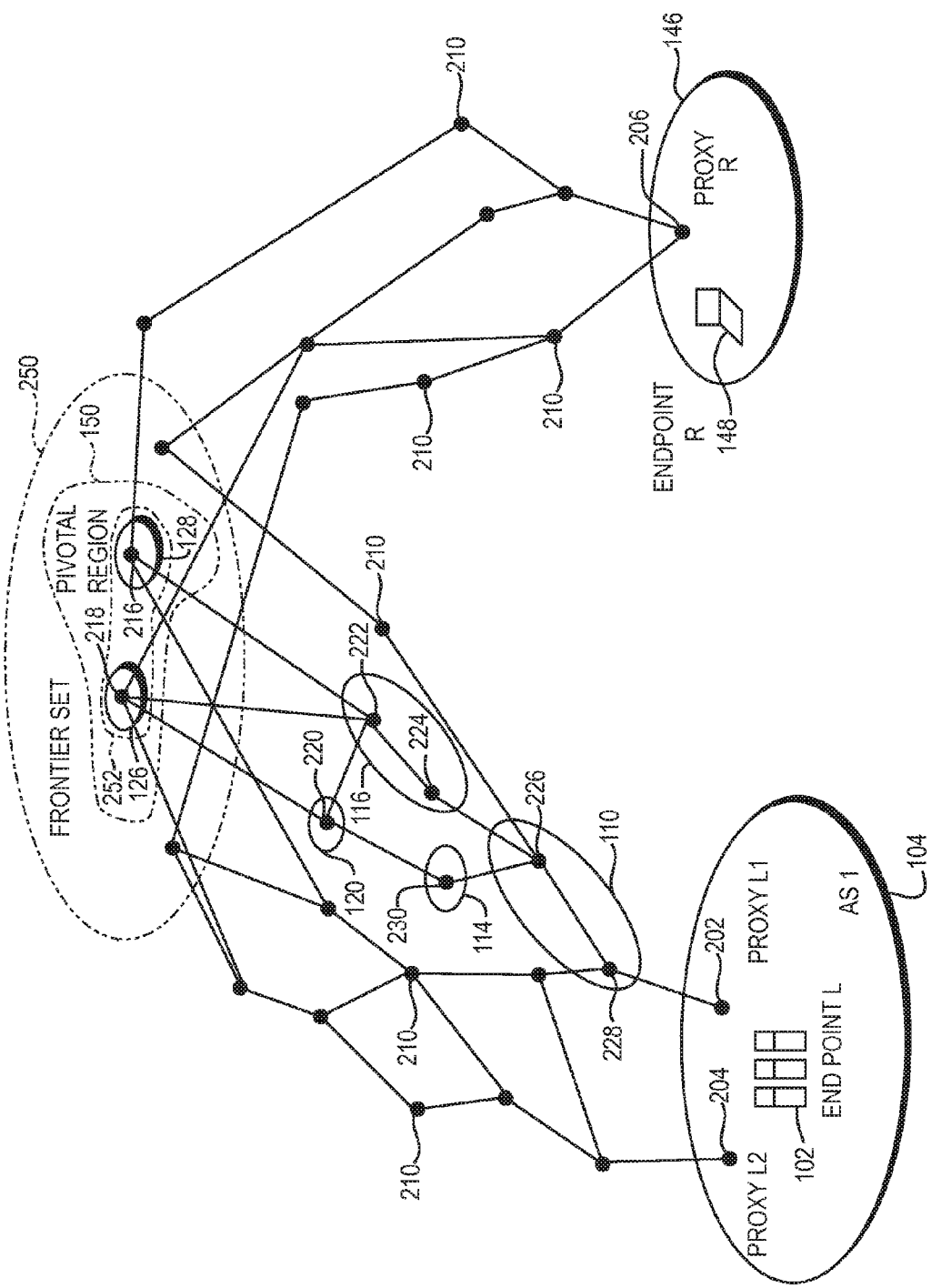
FIG. 2B schematically depicts a likely router level partial paths based on different modes, according to one embodiment.

For the sake of convenience, only a part of the router-level path from the Proxy L1 202 up to the pivotal frontier subset 252 is depicted in FIG. 2B. In general, end-to-end router-level paths exist between the two proxies associated with two end points, in both directions. Also for the sake of convenience, all AS's in the pivotal region 150 are not depicted in FIGS. 2A and 2B. One or more routers may exist within those AS's (such as AS's 122, 124) and other router-level paths may be identified to/from Proxy L1 202, Proxy L2 204, and Proxy R 206. FIG. 2B depicts that the pivotal region 150 is included within or encompassed by the frontier set 250. In some embodiments, however, the pivotal region and the frontier set may only partially overlap or may not overlap at all. If the pivotal region and the frontier set do not overlap, the pivotal frontier subset is initially empty, but routers to be included in the pivotal frontier subset can be identified as described above.

A pivotal region can be associated with a selected mode, in which case the pivotal frontier subset corresponds to that mode. The pivotal region can also be associated with more than or all modes (such as the pivotal region 150), and in that case the pivotal frontier subset may be associated with more than one modes, such as the pivotal frontier subset 252. Finally, each end point may be associate with one, two, or more proxies and any AS on an AS-level path may include one, two, or more routers. In fact, an AS typically includes tens, hundreds, or even more routers, some or all of which may be identified as part of the router-level paths.

Step 4. Simplification and Aggregation

We take a few additional steps to simplify the resulting connectivity graph for presentation and interpretation. Recall that our global graph G includes weights for each edge, and that these weights are computed independently for every traceroute target prefix supported by a given edge. The subgraphs supporting L and R, which we merge along the frontier, allow us to prune poorly-supported nodes and subpaths that are dominated by more popular alternative paths within the same provider, exposing the most likely paths. We also merge multiple target nodes in L and R that have common prefix membership and routing. Finally, we merge transit nodes that we can identify as alternative interfaces on the same router.

II. Predictive Path Weighting

The final graphs generated by the topology prediction phase, one for each connectivity mode, can be thought of as a set of plausible alternative physical connectivity options between L and R. Which mode is actually used for communication from L to R, and back again, is likely to be different (path asymmetry), and will vary over time.

We next describe various techniques for predicting which modes, and which paths through each mode graph, will give rise to the most likely paths traffic will actually take in each direction between two arbitrary endpoints.

Step 1: Mode Selection

The first step is to identify the relative probabilities of selection for each connectivity mode (each based on an observed or inferred BGP AS path from end to end) in each direction between the endpoints of interest.

We observe that BGP reachability of the two endpoints varies throughout the course of the day, as local routing announcements change. One way of predicting the probability of each connectivity mode in each direction between the endpoints at a particular moment is to take into account the specific BGP announcements last seen by a particular set of BGP observers (peering routers throughout the Internet) at a given moment. The observation of each BGP observer/peer, i.e., the BGP data collected by that BGP observer/peer forms, at least in part, a perspective thereof.

Integrating Global BGP Peer Perspectives

For example, at a given moment, we may survey each of several hundred BGP sources, examining and integrating the most recent BGP updates (or withdrawals) from that source to determine the FIB (Forwarding Information Base) entry corresponding to the endpoint IP prefixes corresponding to L and R. By surveying the "opinions" of the best routes (and backup routes not taken) at each of these BGP observation points, we can arrive at an indirect determination of the ASN-level path preferences held by representative points within the routing system worldwide.

We can use these observations directly to establish global path weights (for example, 40% of BGP peers worldwide (i.e., the BGP observation points) have a best route through Cogent to one of the endpoints. Cogent is an example of an AS—typically a level 1 or level 2 AS which could be in the pivotal region. Another 30% have a best route through Level (3), another 20% through Singapore Telecom, and so forth). Level(3) and Singapore Telecom are also examples of AS similar to Cogent.

Selecting Similar BGP Peer Perspectives

Alternatively, we can examine the subset of global BGP peers whose own connectivity most closely resembles that of the counterparty endpoint. For example, if endpoint A is inside the customer cones of Level(3) and Cogent, we may more highly weight the best route preferences of our BGP peers that are also within the customer cones of Level(3) and/or Cogent when predicting the most popular routes that endpoint A might take to reach endpoint B.

Either way, by combining relevant best-path observations from across our BGP peering set (including policy-signaling factors such as AS path prepending), and by taking into account the behavior of the BGP protocol's decision process and tie-breaking procedures on the actual routes announced by the originating autonomous system for each endpoint, we can predict and weight the most likely connectivity modes from among those identified as potential candidates in the topology prediction phase.

Out of Band Policy Information

We may also use out-of-band information about the providers in question, or data learned from external sources such as flow measurements, to manually steer the calculation of mode probabilities. This is particularly important when considering the probability that a given mode will be used for outbound connectivity. In practice, this decision often includes establishment of a single preferred outbound provider (a "default route") for cost or other reasons; a default route is not normally exposed to direct measurement by either inbound traceroutes or announced BGP routes.

Our own outbound traceroute measurements from a large, diverse set of collection locations can be mined for insight into such policy decisions under a range of transit provider diversity conditions. For example, we can use our own traceroute collector population to estimate the likelihood that an endpoint with Level(3) and Cogent transit will simply "point default" at the Cogent link, causing the Cogent mode(s) to be disproportionately selected for connectivity to a broad range of remote traceroute targets.

Integrated Mode Weighting

Finally, having integrated all of these sets of observations, we generate a "directional mode weighting" for each of the potential connectivity modes identified by the topology prediction phase. That is, we can assign distinct probabilities of selection for each connectivity mode on paths from L to R, and from R to L (the return path). These probabilities can either be time-integrated (over the course of a period of observation, such as a day), or instantaneous (determined by routing and other information integrated through time to a particular single instant at which the prediction is valid).

Step 2: Intra-Mode Path Selection and Mode Splitting

Having identified the modes (AS paths) along which traffic may flow, and having weighted the probability of selection of a particular mode in a particular direction between the endpoints, the next step is to weight the likelihood of selection of the various potential router-level paths that support the given connectivity mode.

In practice, this reduces to the challenge of determining the likely paths through each provider's network along the path, and determining the most likely points at which providers may hand off traffic to each other in each direction along the path.

Predicting Inter-Provider Handoffs

The methodology for choosing among the various entry/exit paths between two global carriers is based on heuristics and rule-based reasoning. Pure graph-theoretic strategies such as shortest path, maximal support, etc. are unlikely to reproduce longstanding conventions and best practices, such as cold-potato interdomain routing among settlement-free peers. Moreover, such practices virtually guarantee the existence of asymmetric physical paths between the endpoints, even within the "single" connectivity mode represented by one end-to-end AS path among many.

To integrate these variants into our path calculations, we consider each mode as a "generator" for a set of physical paths in each direction, each of which is consistent with the overall ASN-level routing associated with the mode in question, but which can be weighted and considered separately in terms of the relative probability of adoption for use from each endpoint.

Graph-Based Path Calculations

For example, when evaluating competing paths across a peering relationship between two cooperating providers, we can use a min-max calculation (in which we attempt to find an inter-provider handoff point that maximizes time and/or hopcount on one provider's network, while minimizing the time and/or hopcount spent on the other provider's network en route to the endpoint. Depending on which leg is minimized and which maximized, this combination of constraints allows the model to simulate the primary kinds of inter-provider exit strategies (hot- and cold-potato routing) encountered in settlement-free peering adjacencies.

Observed Traversal Count Support

We can also take into account the relative frequency of traversal of different combinations of entry/exit points between two providers in order to rank probable inter-provider handoff points in support of a given connectivity mode. Our global graph G stores the weights (edge traversal counts) observed over time for each edge, en route to each target prefix on Earth. We can therefore consider the relative popularity of different inter-provider handoff sites, integrating observations for one target prefix, or for a larger set of target prefixes such as those originated by a given autonomous system or within a given geographic region, depending on the endpoints.

Predicting Intra-Provider Path Selection

Another strategy for path weighting involves the use of edge weighting from our original traceroute set to determine distinct paths through a single provider's core, and estimate their relative selection probabilities in various scenarios. This allows us to integrate and examine the total weighting on edges supporting various paths through G in support of a given connectivity mode.

In many cases, these edge traversal counts can reveal that traffic to a single prefix or set of prefixes (geographic region, ISP, etc.) may favor a limited number of entry and exit points within a given provider's transit network, and therefore predict as more likely intra-provider paths connecting those points. When there are multiple distinct paths through a single provider's network, we can often effectively split a single connectivity mode predicted by BGP into multiple connectivity modes, corresponding to these distinct paths, each with a modeled weight of selection.

For example, on a global carrier's network, there may commonly be a "short path" and a "long path" towards a given customer: one corresponds to the shortest, most direct route (which may be expensive and/or congested) and the other to the indirect route going the long (wrong) way around the Earth. We can use our destination-based edge weightings to estimate the relative probabilities that each of these submodes will be used in practice to reach a particular destination through particular exit points, given the fact that traffic has reached the carrier's network at a particular entry point. The relative probabilities of these paths may take other factors into account; for example, the time of day and the paths predicted for other destinations served by the same provider.

Feeding Back Performance Data

Finally, we can impose additional "common sense" heuristic constraints on the paths selected within a given provider, and between interconnected providers. For example, we can incorporate latency data from the next phase, or geolocation data about the particular routers participating in each path, to downweight as unlikely those paths that incorporate undesirable predicted performance or geographic wandering.

For example, we may exclude as unlikely multiple ocean-crossing routing hops from North America to Europe and back again between North American endpoints. Or we may downweight circuitous paths whose total modeled round trip latency is substantially longer than the average latencies on other available paths. Or we may penalize paths across edges or through router interfaces that are believed to be congested (detected from diurnal loading patterns in latency or packet loss in the next phase).

We know that all of these suboptimal routing conditions do occur on the Internet in real life, but they tend to elicit customer complaints and find resolution fairly quickly, making them less likely to be among the predicted paths on an average day.

In general, the system attempts to determine the most likely router-level path that traffic will take within an autonomous system, to a handoff point with another autonomous system. This requires inference of the real-world routing policies that have been agreed upon between the two autonomous systems in question. In practice, these policies are not publicly announced and can vary widely. These policies can be determined by monitoring and analyzing BGP data. Once a policy is determined, entry and exit points of an AS and the intra-AS paths can be determined.

Figure 3A:
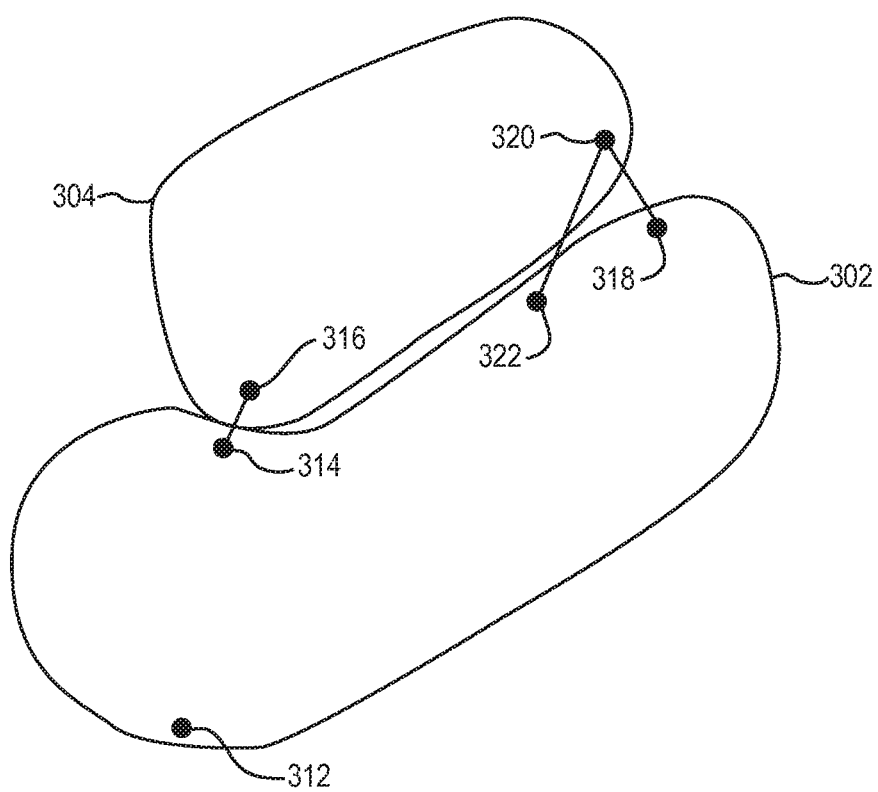
FIG. 3A schematically depicts selection of entry and exit points according to one embodiment.
Figure 3B:
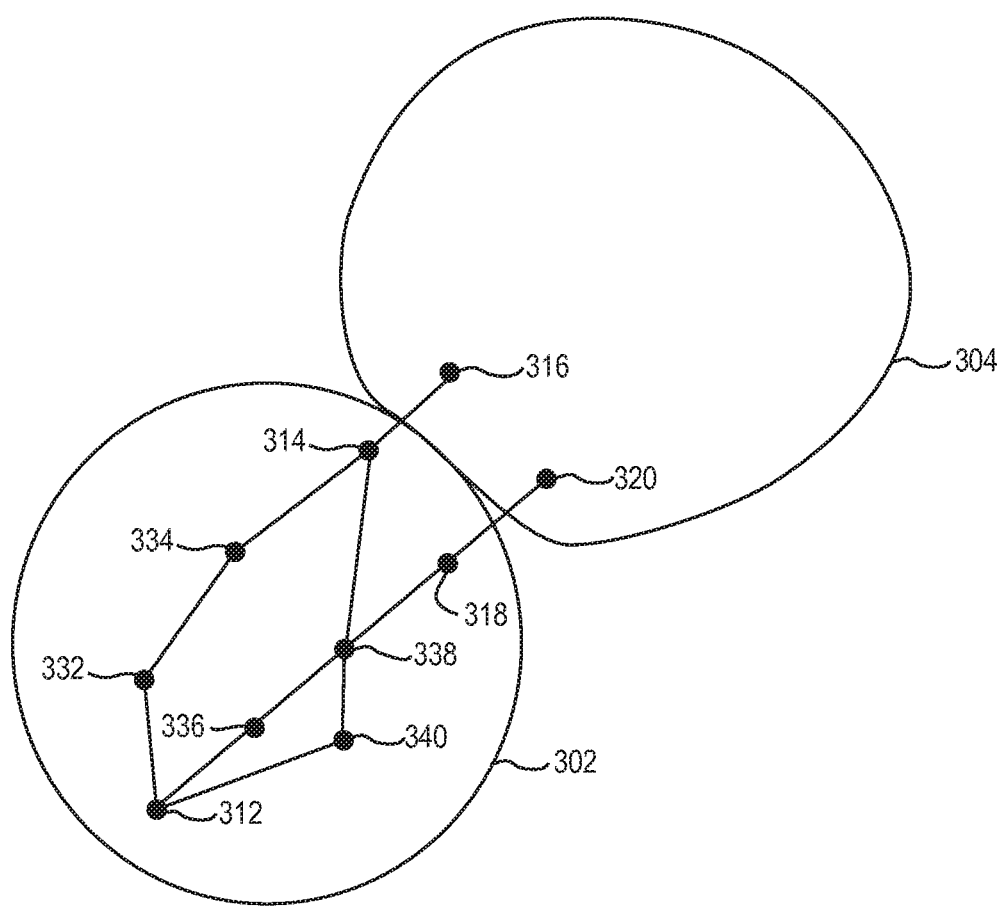
FIG. 3B schematically depicts selection of intra-AS paths according to one embodiment.

For example, with reference to FIG. 3A, the hand off policies include "hot potato routing" (exit at the first opportunity). The hand off occurs between AS 302 and AS 304, which are neighbors on a AS-level path from a source endpoint to a destination endpoint. A router 312 is an entry point into AS 302. According to hot potato routing, an exit point 314, which is "nearest" to the entry point 312 is selected. The exit point 314 hands off traffic to an entry point 316 in AS 304, for subsequent delivery to the end destination. In this context, "nearest" can mean having the shortest hop count, shortest actual distance, shortest delay, etc.

If the hand off policy is determined to be "cold potato routing" (exit as "close" to the ultimate destination as possible), the hand off may occur at another exit point 318 instead of at the exit point 314. In this case, traffic is handed off to router 320 of AS 304. "Close" for these purposes can be router-level hop count, geographic distance in miles, or city-level points of presence traversed (e.g., number of large cities along the path, where the two autonomous systems may have the opportunity to exchange traffic). Providers often select this strategy if they have a well-provisioned network and want to keep the traffic as long as possible to maximize quality of service. Once the traffic has been handed to the next ASN, the provider loses control over how the traffic is treated. In this embodiment, the hopcount within the next AS is not necessarily minimized, but the distance between the handoff and the ultimate destination (which may or may not be within the AS to which hand off is made) is minimized. Again the "distance" metric can include, for example, remaining router hop count, remaining geographic distance, or remaining cities to be traversed. Other more selective agreements governing specific kinds of traffic and specific points of interchange may also be determined from the BGP data. For example, traffic of a certain kind (e.g., voice traffic, video traffic, and traffic destined for a specific geographic location) may be handed off via exit point 322 in AS 302 to the entry point 320 in AS 304.

In one embodiment, the model for path determination can be selected in advance; e.g., we may assume hot-potato routing (the most common case between peers), based on a peering relationship that was determined to exist based on BGP data. In another embodiment, we infer the policy based on previously collected traceroutes through a certain AS to other targets (e.g., proxies of destination endpoints) whose autonomous system origination and/or geography is similar to the selected destination endpoint. The statistics and/or inferences are usually drawn from traces directed toward the traffic targets (i.e., the endpoints), since all Internet policies are generally concerned with getting traffic closer to its destination. Alternatively, or in addition, the statistics and/or inferences can be based on the AS properties and/or traceroutes from a source (e.g., a proxy of a source endpoint) whose autonomous system origination and/or geography is similar to the selected source endpoint.

Different approaches can also be combined; for example, we can think of each pair of connected routers within an AS as having been observed with a given frequency in general (for all traces, for all traffic traversing the AS, over a long period of recorded time). For example, with reference to FIG. 3B, the path from the entry point 312 to the exit point 314 via nodes (e.g., routers) 332, 334 may be taken at frequency f1. The path between the same entry and exit points via nodes 336, 334 may be taken with frequency f2; and via nodes 336, 338 may be taken with frequency f3. In addition, a path from the entry point 312 to the exit point 318 via nodes 336, 338 may be taken with frequency f4 and the path between the nodes 312, 318 via nodes 340, 338 may be taken with frequency f5. Moreover, we also consider the frequencies of links between neighbor nodes such as 336, 334; 336, 338, 340, 338, etc. We can select as more likely a path to an exit point that corresponds to a maximum of the average recorded traversal frequencies across the path's constituent edges. In general, the likelihood of selecting a path is a function of the relative weights (frequencies of traversal) of the edges that form the path. These weights are typically derived from the traceroute observations. The path selection may also be directed by the relative weights of only a subset of edges/routers along the path.

We can think of each pair of connected routers within an AS as having been observed with a given frequency in a particular destination situation (restricting our analysis to the subset of traces whose destination is the destination is the destination endpoint, or proxy of the destination endpoint, or whose destination is within the same geographic region (city, country) as our second destination, or both). In the example discussed above, the frequencies f1 through f5 are general frequencies. Instead, we can consider frequencies s1 through s5, where s1 is the frequency at which the path between the nodes 312, 314 via nodes 332, 334 is taken for traffic to be ultimately directed to a specified destination endpoint. The other frequencies, s2 through s5 can be similarly computed by taking into consideration the traffic destined for the selected destination endpoint. We can then select among paths as in the previous case, but using the situational frequencies instead of the general frequencies to select the most likely paths and therefore the most likely exit/handoff points.

Similarly, we can use the frequencies of edge traversal based on observations collected within a limited time range, rather than using all the traces collected over a long time range. For example, we can restrict our analysis to recent history (traces from the last hour, or the last day) since paths change over time. Or we can restrict our analysis to a particular recurring time window (the same time of day over the course of a week, the same day of the week over the course of a year) because traffic exchange policies may have a seasonal component—for example, traffic may flow differently between providers during the busiest hours, in the early evening local time, and during the lightly loaded weekend days.

We generally assess the complete end-to-end path between the two endpoints, and that includes performing the above-described analyses in two ways—once forward, using the destination (second) endpoint to guide path selection from the source (first) endpoint, and again backwards, using the source (first) endpoint to guide the path selection back from the destination (second) endpoint. These two forward/backward paths between the endpoints are often not the same. Hot potato routing, for example, easily generates path asymmetry, as each side of the communication wishes to find and preferentially exploit the nearest exit point to the other.

III. Predictive Path Performance

After topology prediction and path weighting, the third PRIM challenge is the estimation of the performance characteristics of our inferred end-to-end paths, based on partial observations of the performance of individual network segments.

We approach this challenge in two ways: at the connectivity mode level (essentially, predicting the variability of AS paths between two endpoints based on the BGP routing history of either) and predicting packet loss, jitter, and round trip latency between endpoints based on the most probable physical (router-level) paths between them.

Step 1: Connectivity Mode Stability

We can associate transition probabilities between members of the set of plausible connectivity modes that PRIM predicts. In each case, the receipt of a BGP UPDATE message containing the withdrawal of a key route (the transit path through a given provider at one endpoint, for example) can render some connectivity modes unavailable, and cause others to be selected.

We can predict the next-most-probable backup path that would be selected in the absence of the withdrawn route, once global routing has converged, and in so doing, assign a transition probability to each other mode that may replace it. Changes in routing affecting one endpoint may affect inbound connectivity from the other endpoint, or they may affect the outbound path as well (for example, when the predicted default route for outbound traffic goes away as the provider connection is lost).

Similarly, when a new route becomes available (for example, because a transit provider connection has been restored, or because the endpoint in question has gained a new transit provider) we can model the probability that connectivity in- and outbound will shift to take advantage of the newly accessible modes.

Based on the intraday history of the routing stability of the endpoints, we proceed to construct a model of the stability of each connectivity mode: the probability that traffic in flight will be forced to take different paths within a short time. Continuous path change, can create conditions for poor performance of TCP-based applications such as voice and video, especially across fiber-optic runs at intercontinental distances, where the bandwidth-delay product is high. This is especially true when the predicted performance of competing paths varies significantly (potentially resulting in out-of-order delivery of packets within the application's traffic stream).

Step 2: Path Stability and Performance

Within a particular connectivity mode, we can also model the end-to-end performance of a predicted physical path between two endpoints. To accomplish this, we integrate a large number of individual observations of the round-trip latencies between our traceroute collectors and each individual router interface (or "hop") along the paths to all of our worldwide traceroute targets.

Node and Edge Performance Prediction

With these measurements, we start by creating a model of the latency across each edge in the global graph G (the time taken for packets to travel between two connected router interfaces). This model may take into account the delay across each router (the time added by each node in the graph, a function of buffer depth and queuing delay) as a separate distribution from the latency across each connection (the time added by each edge in the graph, dominated by speed-of-light concerns). These measurements may be performed using traces to both proxies from a large set of collectors. In particular, a collector performs a measurement at a router along the way en route to a proxy. In other words, a traceroute measurement contains timing measurements to each of the router-level hops along the way from a collector to a target (e.g., proxy). The relative timing of the measurements to two connected router interfaces gives us the timing statistics for the "edge" between those two router interfaces. The model of each router interface/edge can be updated based on additional measurements and/or feedback, and from the updated models, ultimately the aggregate model of an entire path that includes all the connected edges and router interfaces can also be updated.

We can distinguish the two phenomena (the delay associated with a node/router interface and the delay associated with an edge between two routers interfaces), by the characteristics over time of their individual contributions. The speed-of-light contribution from edge delay is most typically modeled as a fixed mode (the physical distance across most links does not vary appreciably; nor does the transmission medium) with some narrow spread due to measurement error. The queuing delay at each router contributes a quite different (often heavy-tailed) variable delay due to congestion, which can create visible time-of-day and day-of-week sinusoidal dependencies.

Path Performance Prediction

Working with a set of performance models for individual nodes and edges in graph G, we can iteratively refine the models by predicting the aggregate path performance of known (measured) end-to-end paths, and then feeding back corrections to the individual models.

For example, the difference between measured time and modeled time can be divided among the contributing edges according to some proportional rule, and fed back as a model correction. Through a large number of iterative corrections, the models for performance across each edge and through each node will tend to converge on the true distributions for latencies (assuming that these true distributions are appropriately stationary over the period of observation).

As a refinement, rather than naively assuming path symmetry, we can take into account the most probable return paths generated by our previous PRIM phase, thus supplying a more accurate model for the invisible return path upon which each measured traceroute depends. Since the end-to-end performance of a traceroute path is just as often determined by the characteristics of the return path as by the visible forward path, this allows us to generate significantly more accurate models of the latency distributions across nodes and edges using the available latency measurement data.

Path Integration Methods

Even when accurate models of individual edges and nodes are not possible from the data (for example, because two nodes are always seen in sequence, making it difficult to untangle their individual contributions to latency) we can still compute models for the connected nodes or entire subpaths as a group, with the same kind of composite latency distribution.

In general, we can derive latency distributions for any path or set of paths through G by performing convolution of successive individual latency distributions along the paths. At a branching point (two or more potential paths) we scale down each distribution by the weighted probability that the given path is taken, as determined by our previous path-weighting methodology; at a merge point (two or more paths coming together at a common interface) we add the incoming latency distributions. In this way we can derive complex composite latency distributions for the paths between two endpoints, taken as a whole; we can also derive simpler latency distributions for each contributing path between the endpoints.

When direct measurements are available, we can compare these models to the distributions observed and feed back corrections to previous model phases; for example, the observed latency distribution may cause us to adjust our model of the weighted probability that a given path is taken (because the measured latencies associated with that path are not in evidence as a predicted mode in the end-to-end latency distribution).

It should be noted that in these computations, the path taken into consideration is a router-level path between proxies to the endpoints of interest, and the path is based on a connectivity mode, e.g., an AS-level path between the two endpoints. As such, the estimated performance of the path is expected to be a close approximation of the performance of an actual path between the two endpoints.

Some known systems can measure or estimate performance of an actual path between the endpoints of interest. As such these known systems require access to at least one of the actual endpoints, and hence, cannot be used when such access is unavailable. In this context, access requires the administrative ability to run traceroute from the node (e.g., an endpoint), or otherwise to perform active measurement of the connectivity and performance of the network paths that are reachable from that node. The techniques we described above provide estimates without requiring access to any endpoint of interest.

Some known systems can measure or estimate performance of paths between proxies to the endpoints. Unlike the techniques we described above, however, the estimates according to known systems are not based on timing models. Instead, these measurements or estimations are based directly on measurements and computations performed at at least one of the proxies. Even though access to a proxy may be available in general, it may not be available when the performance estimate is required. Also, the paths for which the performance is determined according to the known systems are not selected according to one or more connectivity modes (AS-level paths). The model based system does not require measurements from or to an endpoint.

Additional Applications

We can use the modeled performance of particular paths to infer additional information about the nodes and edges that support those paths. For example, we may use commonalities in latency distributions to conclude that two router interfaces are in the same geographic region, or even in the same facility.

Or we may use information about the modes in the performance distribution to infer the details of connectivity; for example, we may interpret particular long latency modes as indicating that particular links are implemented as LEO or geosynchronous satellite hops, either with symmetric connectivity or with an asymmetric return path provided over terrestrial connectivity.

We can use our latency models to predict the "fitness for purpose" of a given path to support the connectivity requirements of a given class of applications; for example, a high-latency path may support asynchronous file transfer and email, but may be inappropriate for supporting voice and video applications. A path with low average latencies, but high variance, may be particularly problematic for real-time applications with low jitter tolerance.

Together, the PRIM methodologies allow us to characterize the paths traffic may take through the Internet between two endpoints of interest, whether those paths are real (consistent with observation) or counterfactual (available by purchasing a new transit connection or establishing peering with a new partner). Paths and their performance can be predicted for a broad range of Internet counterparties, scaling from single IP endpoints to network prefixes, service providers, and even entire geographic regions. PRIM path analysis allows us to construct "what-if" scenarios, modeling the changes in connectivity and application performance that would result if a key connection were disrupted, or if a key network performance bottleneck were resolved. In many cases, it allows us to identify points of potential congestion and disruption ("chokepoints") representing significant risks to a given connectivity pattern, so that they may be defended against.

PRIM allows us to rate and rank the available modes of connectivity, and physical paths supported by those modes, so that a customer can quantify and audit the benefits and drawbacks of their available connectivity to global Internet counterparties. Key provider dependencies, potentially problematic or fragile connectivity modes, and the underlying causes of WAN performance issues are among the business issues that can be exposed by the application of the PRIM modeling techniques to an enterprise's Internet connectivity.

In our testing, PRIM has successfully distinguished among probable paths to many globally distributed networks (Hotmail Singapore versus Hotmail US, for example) from arbitrary points of interest. It has also succeeded in localizing many of the provider—provider handoffs that carry traffic out of a given ISP at an ASN level; that is, the AS path visible in a manual traceroute from an IP address within that ISP is usually one of the connectivity modes identified by PRIM. Within these modes, PRIM's predictions of the cities and countries traversed—and in many cases, the specific routers encountered along the way—are often in close agreement with empirical observations.

Key inputs to the process (the global connectivity graph G, the map of occult ASN adjacencies not evident in BGP, the "edge tag" relationships that distinguish peering from transit, the graph of transit support relationships for each routed prefix, the measurements of latency to each traceroute target and each intermediate hop, and the interface-level maps of individual provider core networks used to construct bridging approximations) are all products with a short shelf-life, thanks to the dynamic nature of Internet relationships.

Caution must be therefore be used in applying predicted paths far from the original time of calculation, in a nonstationary global environment in which underlying routing or policy conditions may have shifted significantly.

It is clear that there are many ways to configure the system components, interfaces and methods described herein. The disclosed methods and systems can be deployed on convenient processor platforms, including network servers, personal and portable computers, and/or other processing platforms. Other platforms can be contemplated as processing capabilities improve, including personal digital assistants, computerized watches, cellular phones and/or other portable devices. The disclosed methods and systems can be integrated with known network management systems and methods. The disclosed methods and systems can operate as an SNMP agent, and can be configured with the IP address of a remote machine running a conformant management platform. Therefore, the scope of the disclosed methods and systems are not limited by the examples given herein, but can include the full scope of the claims and their legal equivalents.

The methods and systems described herein are not limited to a particular hardware or software configuration, and may find applicability in many computing or processing environments. The methods and systems can be implemented in hardware or software, or a combination of hardware and software. The methods and systems can be implemented in one or more computer programs, where a computer program can be understood to include one or more processor executable instructions. The computer program(s) can execute on one or more programmable processors, and can be stored on one or more storage medium readable by the processor (including volatile and non-volatile memory and/or storage elements), one or more input devices, and/or one or more output devices. The processor thus can access one or more input devices to obtain input data, and can access one or more output devices to communicate output data. The input and/or output devices can include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) can be implemented using one or more high level procedural or object-oriented programming languages to communicate with a computer system; however, the program(s) can be implemented in assembly or machine language, if desired. The language can be compiled or interpreted.

As provided herein, the processor(s) can thus be embedded in one or more devices that can be operated independently or together in a networked environment, where the network can include, for example, a Local Area Network (LAN), wide area network (WAN), and/or can include an intranet and/or the Internet and/or another network. The network(s) can be wired or wireless or a combination thereof and can use one or more communications protocols to facilitate communications between the different processors. The processors can be configured for distributed processing and can utilize, in some embodiments, a client-server model as needed. Accordingly, the methods and systems can utilize multiple processors and/or processor devices, and the processor instructions can be divided amongst such single or multiple processor/devices.

The device(s) or computer systems that integrate with the processor(s) can include, for example, a personal computer(s), workstation (e.g., Sun, HP), personal digital assistant (PDA), handheld device such as cellular telephone, laptop, handheld, or another device capable of being integrated with a processor(s) that can operate as provided herein. Accordingly, the devices provided herein are not exhaustive and are provided for illustration and not limitation.

References to "a microprocessor" and "a processor", or "the microprocessor" and "the processor," can be understood to include one or more microprocessors that can communicate in a stand-alone and/or a distributed environment(s), and can thus can be configured to communicate via wired or wireless communications with other processors, where such one or more processor can be configured to operate on one or more processor-controlled devices that can be similar or different devices. Use of such "microprocessor" or "processor" terminology can thus also be understood to include a central processing unit, an arithmetic logic unit, an application-specific integrated circuit (IC), and/or a task engine, with such examples provided for illustration and not limitation.

Furthermore, references to memory, unless otherwise specified, can include one or more processor-readable and accessible memory elements and/or components that can be internal to the processor-controlled device, external to the processor-controlled device, and/or can be accessed via a wired or wireless network using a variety of communications protocols, and unless otherwise specified, can be arranged to include a combination of external and internal memory devices, where such memory can be contiguous and/or partitioned based on the application. Accordingly, references to a database can be understood to include one or more memory associations, where such references can include commercially available database products (e.g., SQL, Informix, Oracle) and also proprietary databases, and may also include other structures for associating memory such as links, queues, graphs, trees, with such structures provided for illustration and not limitation.

References to a network are not limited to the full Internet, and can include portions thereof. References herein to microprocessor instructions or microprocessor-executable instructions, in accordance with the above, can be understood to include programmable hardware.

Unless otherwise stated, use of the word "substantially" can be construed to include a precise relationship, condition, arrangement, orientation, and/or other characteristic, and deviations thereof as understood by one of ordinary skill in the art, to the extent that such deviations do not materially affect the disclosed methods and systems. Further, references herein to real-time can be understood to be abbreviations for "substantially in real-time." Although the illustrated embodiments of the methods and systems refer to certain aspects being in "real-time," such aspects may be provided in other manners.

Throughout the entirety of the present disclosure, use of the articles "a" or "an" to modify a noun can be understood to be used for convenience and to include one, or more than one of the modified noun, unless otherwise specifically stated.

Although the methods and systems have been described relative to specific embodiments thereof, they are not so limited. Obviously many modifications and variations may become apparent in light of the above teachings.

Many additional changes in the details, materials, and arrangement of parts, herein described and illustrated, can be made by those skilled in the art. Accordingly, it will be understood that the methods and systems provided herein are not to be limited to the embodiments disclosed herein, can include practices otherwise than specifically described, and are to be interpreted as broadly as allowed under the law.

Accordingly, I claim:

1. A method of estimating intra-mode paths, the method comprising the steps of:
   receiving in memory at least a partial likely autonomous system (AS)-level path comprising a first AS and a second AS, the at least partial likely AS-level path corresponding to a mode of communication between a first endpoint and a second endpoint;
   monitoring and analyzing by a processor border control gateway protocol (BGP) data received from at least one BGP observer;
   inferring based on, at least in part, the analyzed BGP data, by the processor, at least one of: (i) a routing policy of the first AS and (ii) a routing policy of the second AS;
   selecting by the processor a first hand off pair comprising an exit point from the first AS and an entry point into the second AS, the exit point being in communication with the entry point, the selection being based on, at least in part, at least one of: (i) the inferred routing policy of the first AS, (ii) the inferred routing policy of the second AS, and (iii) a statistical property of traffic associated with at least one of a proxy to the first endpoint and a proxy to the second endpoint, the traffic passing via the first AS; and
   identifying by the processor a set of router-level paths within the first AS, from a first entry point into the first AS to the exit point from the first AS within the first hand off pair.

2. The method of claim 1, wherein the property of the first AS comprises at least one of: (i) a number of router-level hop counts within the first AS on a path from the first entry point into the first AS to the exit point from the first AS within the first hand off pair, (ii) a geographic distance between the first entry point into the first AS and the exit point from the first AS within the first hand off pair, and (iii) a number of points of presence associated with both the first AS and the second AS.

3. The method of claim 1, wherein the selection step comprises maximizing a first distance within the first AS, the distance comprising at least one of: (i) a number of hop counts on a path to the exit point from the first AS within the first hand off pair, and (ii) a geographic distance between the first entry point into the first AS and the exit point from the first AS within the first hand off pair.

4. The method of claim 3, further comprising minimizing a second distance from the exit point from the first AS within the first hand off pair to the proxy to the second endpoint, the second distance comprising at least one of: (i) a number of hop counts on a path from the exit point from the first AS within the first hand off pair to the proxy to the second endpoint, and (ii) a geographic distance between the exit point from the first AS within the first hand off pair and the proxy to the second endpoint.

5. The method of claim 1, wherein the selection of the first hand off pair comprises:
   selecting a candidate exit point from the first AS;
   selecting a candidate entry point into the second AS such that a frequency of traversal of traffic between the candidate exit point and the candidate entry point is greater than a selected threshold; and
   designating: (i) the selected candidate exit point as the exit point within the first hand off pair, and (ii) the selected candidate entry point as the entry point within the first hand off pair.

6. The method of claim 5, wherein the frequency of traversal of traffic comprises a frequency of traffic directed to at least one of the proxy to the first endpoint and the proxy to the second endpoint.

7. The method of claim 1, further comprising selecting a router-level path from the identified set of router-level paths such that a path metric corresponding to the selected router-level path satisfies a specified threshold.

8. The method of claim 7, wherein the path metric comprises at least one of a frequency of traversal of traffic via the selected router-level path, delay, jitter, reliability, and availability.

9. The method of claim 7, wherein at least one router-level path in the identified set comprises an intermediate router node, and the path metric comprises a frequency of traversal of traffic via an intermediate router node.

10. The method of claim 9, wherein the frequency of traversal of traffic via the intermediate router node comprises a frequency of traffic directed to at least one of the proxy to the first endpoint and the proxy to the second endpoint.

11. The method of claim 1, further comprising:
   selecting a second hand off pair comprising an exit point from the first AS and an entry point into the second AS, the exit point being in communication with the entry point, the selection being based on, at least in part, at least one of: (i) a property of the first AS, (ii) a property of the second AS, and (iii) a statistical property of traffic associated with at least one of the proxy to the first endpoint and the proxy to the second endpoint, the traffic passing via the first AS; and
   identifying a set of router-level paths within the first AS, from a second entry point into the first AS to the exit point from the first AS within the second hand off pair.

12. The method of claim 11, wherein the second entry point into the first AS is the first entry point into the first AS.

13. A system for estimating intra-mode paths, the system comprising:
   a memory; and
   a processor configured to:
      receive at least a partial likely autonomous system (AS)-level path comprising a first AS and a second AS, the at least partial likely AS-level path corresponding to a mode of communication between a first endpoint and a second endpoint;
      monitor and analyze border control gateway protocol (BGP) data received from at least one BGP observer;
      infer based on, at least in part, the analyzed BGP data, at least one of: (i) a routing policy of the first AS and (ii) a routing policy of the second AS;
      select a first hand off pair comprising an exit point from the first AS and an entry point into the second AS, the exit point being in communication with the entry point, the selection being based on, at least in part, at least one of: (i) the inferred routing policy of the first AS, (ii) the inferred routing policy of the second AS, and (iii) a statistical property of traffic associated with at least one of a proxy to the first endpoint and a proxy to the second endpoint, the traffic passing via the first AS; and
      identify a set of router-level paths within the first AS, from a first entry point into the first AS to the exit point from the first AS within the first hand off pair.

14. The system of claim 13, wherein to select the first hand off pair, the processor is further configured to maximize a first distance within the first AS, the distance comprising at least one of: (i) a number of hop counts on a path to the exit point from the first AS within the first hand off pair, and (ii) a geographic distance between the first entry point into the first AS and the exit point from the first AS within the first hand off pair.

15. The system of claim 14, wherein the processor is further configured to minimize a second distance from the exit point from the first AS within the first hand off pair to the proxy to the second endpoint, the second distance comprising at least one of: (i) a number of hop counts on a path from the exit point from the first AS within the first hand off pair to the proxy to the second endpoint, and (ii) a geographic distance between the exit point from the first AS within the first hand off pair and the proxy to the second endpoint.

16. The system of claim 13, wherein to select of the first hand off pair the processor is configured to:
   select a candidate exit point from the first AS;
   select a candidate entry point into the second AS such that a frequency of traversal of traffic between the candidate exit point and the candidate entry point is greater than a selected threshold; and
   designate: (i) the selected candidate exit point as the exit point within the first hand off pair, and (ii) the selected candidate entry point as the entry point within the first hand off pair.

17. The system of claim 13, wherein the processor is further configured to select a router-level path from the identified set of router-level paths such that a path metric corresponding to the selected router-level path satisfies a specified threshold.

18. The system of claim 13, wherein the processor is further configured to:
   select a second hand off pair comprising an exit point from the first AS and an entry point into the second AS, the exit point being in communication with the entry point, the selection being based on, at least in part, at least one of: (i) the inferred routing policy of the first AS, (ii) the inferred routing policy of the second AS, and (iii) a statistical property of traffic associated with at least one of the proxy to the first endpoint and the proxy to the second endpoint, the traffic passing via the first AS; and identify a set of router-level paths within the first AS, from a second entry point into the first AS to the exit point from the first AS within the second hand off pair.

19. An article of manufacture, comprising a non-transitory machine-readable medium storing instructions that, when executed by a machine configure the machine, for estimating intra-mode paths, to:

receive at least a partial likely autonomous system (AS)-level path comprising a first AS and a second AS, the at least partial likely AS-level path corresponding to a mode of communication between a first endpoint and a second endpoint;

monitor and analyze border control gateway protocol (BGP) data received from at least one BGP observer;

infer based on, at least in part, the analyzed BGP data, at least one of: (i) a routing policy of the first AS and (ii) a routing policy of the second AS;

select a first hand off pair comprising an exit point from the first AS and an entry point into the second AS, the exit point being in communication with the entry point, the selection being based on, at least in part, at least one of: (i) the inferred routing policy of the first AS, (ii) the inferred routing policy of the second AS, and (iii) a statistical property of traffic associated with at least one of a proxy to the first endpoint and a proxy to the second endpoint, the traffic passing via the first AS; and identify a set of router-level paths within the first AS, from a first entry point into the first AS to the exit point from the first AS within the first hand off pair.

* * * * *